United States Patent
You

(10) Patent No.: US 9,525,452 B2
(45) Date of Patent: Dec. 20, 2016

(54) CIRCUIT OF WIRELESS TRANSCEIVER CHIP

(71) Applicant: AIROHA TECHNOLOGY CORP., Hsinchu (TW)

(72) Inventor: Pen-Li You, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 0 days.

(21) Appl. No.: 14/944,325

(22) Filed: Nov. 18, 2015

(65) Prior Publication Data

US 2016/0218768 A1 Jul. 28, 2016

(30) Foreign Application Priority Data

Jan. 22, 2015 (TW) .............................. 104102063 A

(51) Int. Cl.
*H04B 1/38* (2015.01)
*H04B 1/44* (2006.01)
*H03H 7/01* (2006.01)

(52) U.S. Cl.
CPC .............. *H04B 1/44* (2013.01); *H03H 7/0138* (2013.01); *H03H 7/1783* (2013.01)

(58) Field of Classification Search
CPC ........ H04B 1/44; H03H 7/0138; H03H 7/1783

USPC .................... 455/91, 127.1, 114.1–114.3, 73
See application file for complete search history.

(56) References Cited

U.S. PATENT DOCUMENTS

| | | | | |
|---|---|---|---|---|
| 8,891,595 B1* | 11/2014 | Farjadrad | ................ | H04L 12/10 375/219 |
| 9,148,320 B1* | 9/2015 | Pelletier | .................. | H04L 25/08 |
| 9,219,518 B1* | 12/2015 | Chen | ........................ | H04B 1/48 |
| 2009/0253384 A1* | 10/2009 | Gorbachov | .............. | H04B 1/44 455/83 |
| 2015/0326143 A1* | 11/2015 | Petras | ...................... | H02M 7/25 363/127 |
| 2015/0349573 A1* | 12/2015 | Tschirhart | ................. | H02J 7/04 320/108 |

\* cited by examiner

*Primary Examiner* — Edward Urban
*Assistant Examiner* — Max Mathew
(74) *Attorney, Agent, or Firm* — Rosenberg, Klein & Lee

(57) ABSTRACT

A circuit of a wireless transceiver chip is disclosed. In the circuit of the wireless transceiver chip of the present invention, a capacitor is connected between the secondary conductor of the transformer in the transmitter circuit and the ground pad to form a notch filter for filtering the image signal. An ESD protection circuit is connected with the capacitor in parallel. Since the ESD protection circuit is not connected to the signal receiving path, the performance of the chip would not be degraded.

7 Claims, 4 Drawing Sheets

CIRCUIT OF WIRELESS TRANSCEIVER CHIP

FIELD OF THE INVENTION

The present invention is related to a circuit of a wireless transceiver chip, which improves the performance of the wireless transceiver chip and reduces the cost for producing the wireless transceiver chip.

BACKGROUND OF THE INVENTION

Please refer to FIG. 1, there is shown a schematic diagram of the circuit of a wireless transceiver in accordance with the prior art. The circuit 10 of the wireless transceiver comprises a transceiver chip 12 and an antenna. The transceiver chip 12 comprises a transmitter circuit 121 and a receiver circuit 123. The transceiver pad 129 is switched to connect to the transmitter circuit 121 or the receiver circuit 123 by the switch 125. To filter the image signal out, a notch filter 16 comprising an inductor 161 and a capacitor 163 is needed in the circuit 10.

If the notch filter 16 is disposed in the transceiver chip 12, the cost to produce the transceiver chip 12 is increased. On the other hand, if the notch filter 16 is disposed on the circuit board (not shown), the cost is increased for the device producer.

Furthermore, for preventing the elements of the transceiver chip 12 from being damaged by the current of electrostatic discharge, an electrostatic discharge (ESD) protection circuit 127 is connected between the transceiver pad 129 and the ground pad 128 in the transceiver chip 12.

However, the transceiver pad 129 is on the signal path for signal receiving and transmitting. The parasitic capacitance or parasitic inductance between the ESD protection circuit 127 and the signal path degrades the performance of the transceiver chip 12.

SUMMARY OF THE PRESENT INVENTION

It is an objective of the present invention to provide a circuit of a wireless transceiver chip which improves the performance of the wireless transceiver chip and reduces the cost for producing the wireless transceiver chip.

It is another objective of the present invention to provide a circuit of a wireless transceiver chip, wherein a capacitor is connected to the secondary conductor of the transformer of the transmitter circuit in series to form the notch filter for reducing the cost for producing the chip.

It is still another object of the present invention to provide a circuit of a wireless transceiver chip, wherein the ESD protection circuit is disposed between the ground pad and the secondary conductor of the transformer to improve the performance of the chip.

The present invention provides a circuit of a wireless transceiver chip comprising: a transceiver pad connected to an antenna; a ground pad connected to ground; a transmitter circuit for amplifying a transmitting signal, wherein the transmitter circuit has a transformer with a primary conductor and a secondary conductor, the secondary conductor has a first end and a second end, the second end is connected to the transceiver pad; a receiver circuit connected to the first end and the second end of the secondary conductor for receiving a receiving signal; a switch circuit connected between the receiver circuit and the secondary conductor; and a filter capacitor connected between the second end of the secondary conductor and the ground pad.

In one embodiment of the present invention, the circuit further comprises an electrostatic discharge protection circuit connected to the filter capacitor in parallel.

In one embodiment of the present invention, the circuit further comprises a resistor connected to the filter capacitor in parallel.

In one embodiment of the present invention, the switch circuit comprises a first switch unit connected between the first end and the second end of the secondary conductor.

In one embodiment of the present invention, the receiver circuit comprises a filter unit.

In one embodiment of the present invention, the filter unit comprises a capacitor and an inductor connected in series.

In one embodiment of the present invention, the switch circuit comprises a first switch unit and a second switch unit connected between the two ends of the inductor of the filter unit and the second end of the secondary conductor respectively.

DETAILED DESCRIPTION OF THE PREFERRED EMBODIMENTS

Figure 1:
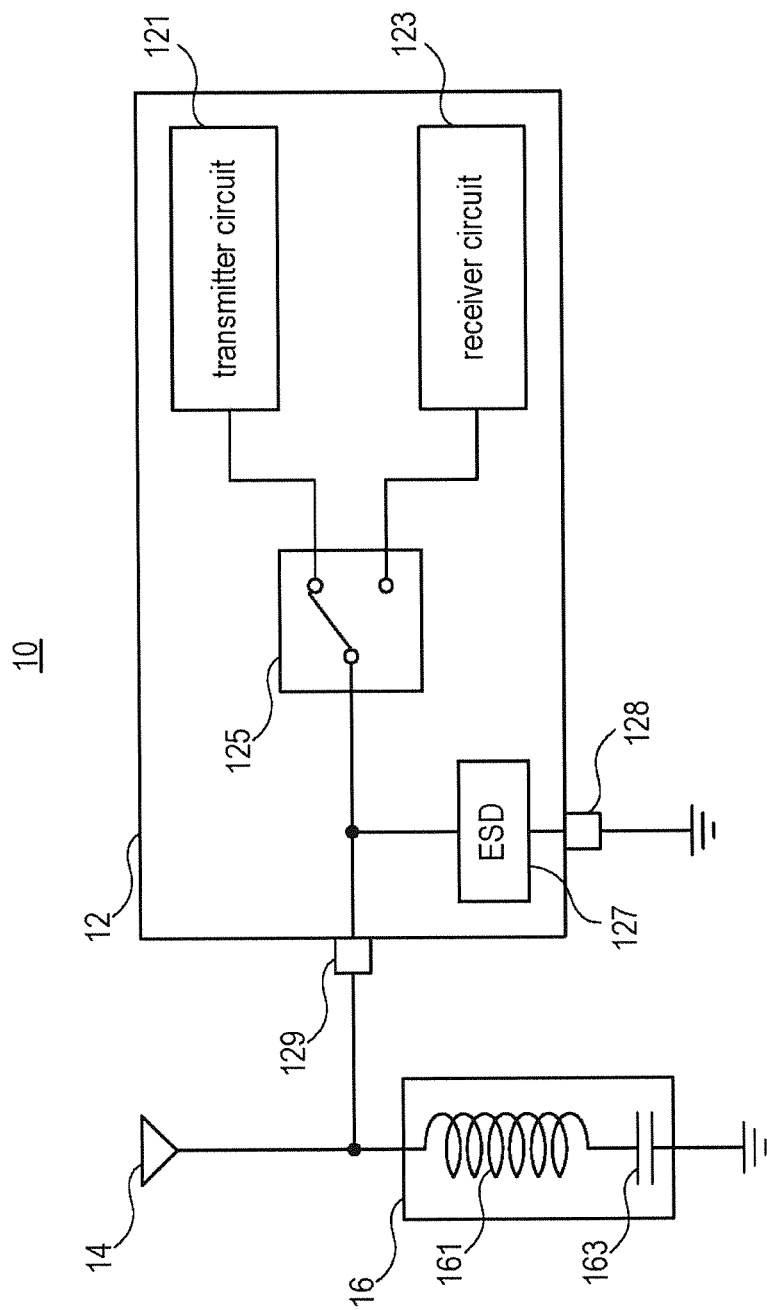
FIG. 1 is a schematic diagram showing the circuit of a wireless transceiver in accordance with the prior art.
Figure 2:
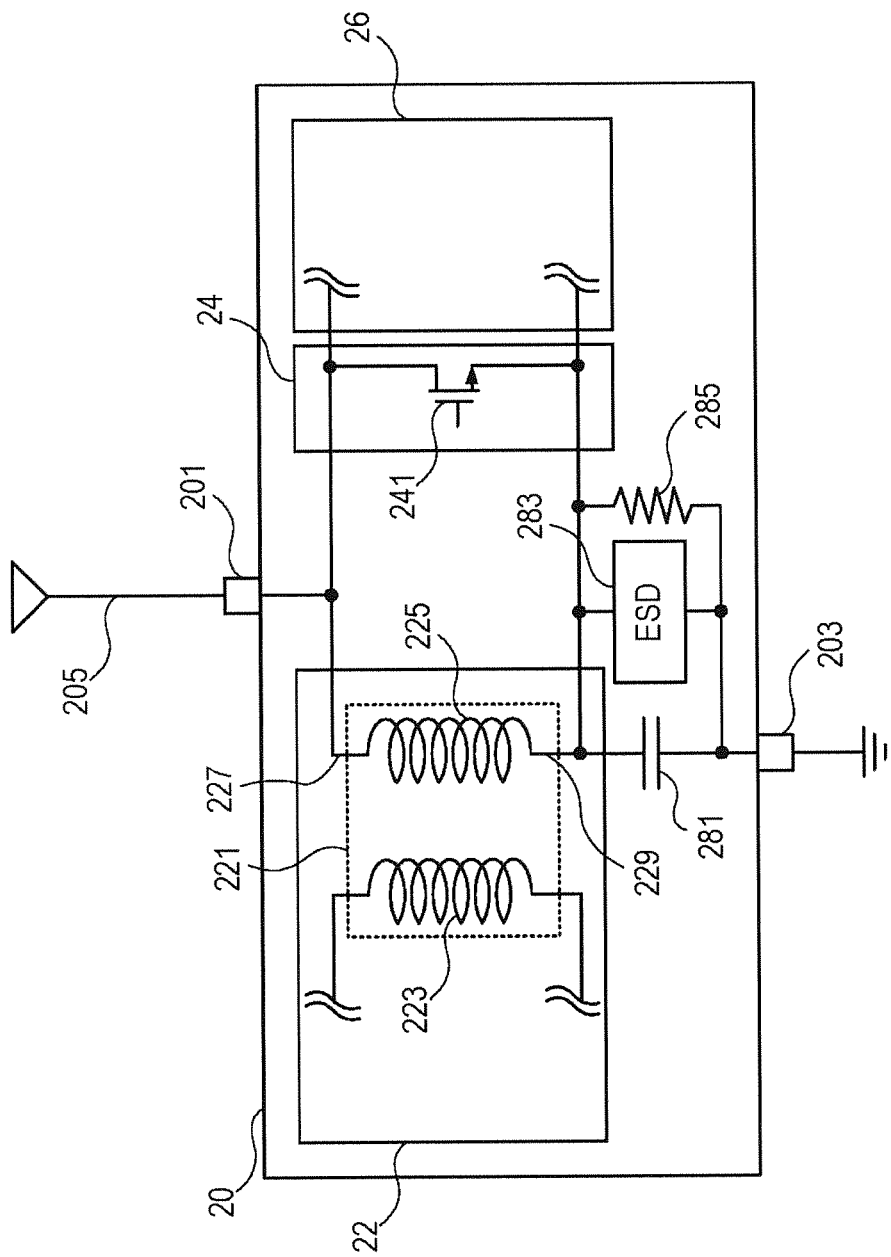
FIG. 2 is a schematic diagram showing the circuit of a wireless transceiver chip in accordance with one embodiment of the present invention.
Figure 3:
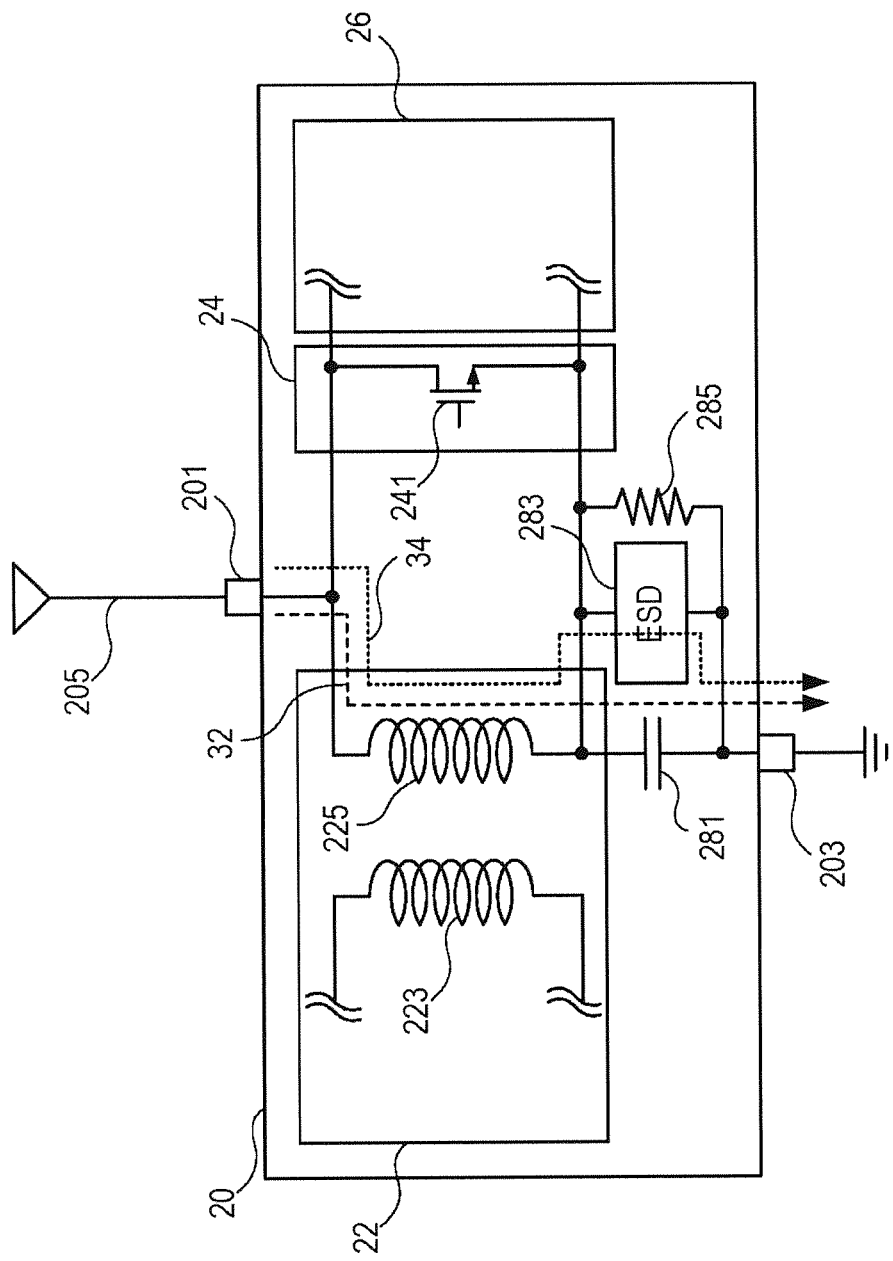
FIG. 3 is a schematic diagram illustrating the signal paths in accordance with the embodiment shown in FIG. 2.

Referring to FIGS. 2 and 3, there are shown schematic diagrams showing the circuit of a wireless transceiver chip and the signal paths thereof in accordance with one embodiment of the present invention. The wireless transceiver chip 20 of the present invention comprises: a transceiver pad 201, aground pad 203, a transmitter circuit 22, a receiver circuit 26, a switch circuit 24, and a filter capacitor 281. The transceiver pad 201 is connected to an antenna 205, and the ground pad 203 is connected to ground.

The transmitter circuit 22 enhances the power of a transmitting signal and transmits the transmitting signal by the antenna 205. The transmitter circuit 22 of the present invention comprises a transformer 221. The transformer 221 comprises a primary conductor 223 and a secondary conductor 225. The secondary conductor 225 has a first end 227 and a second end 229. The first end 227 of the secondary conductor 225 is connected to the transceiver pad 201. The filter capacitor 281 is connected between the second end 229 of the secondary conductor 225 and the ground pad 203 in series. The transmitting signal is amplified by the transmitter circuit 22, coupled form the primary conductor 223 to the secondary conductor 225 of the transformer 221, and transmitted by the antenna 205 through the transceiver pad 201.

The receiver circuit 26 is connected to the first end 227 and the second end 229 of the secondary conductor 225. A receiving signal is received from the antenna 205 through the transceiver pad 201 to the receiver circuit 26. The switch circuit 24 is disposed between the secondary conductor 225 and receiver circuit 26 for switching the signal path.

In the circuit of the wireless transceiver chip 20 of the present invention, a notch filter is constructed by the secondary conductor 225 and the filter capacitor 281 to filter the image signal out. When receiving a signal, the image signal is conducted to the ground pad 203 through the signal path 32 of the secondary conductor 225 and the filter capacitor 281, as shown in FIG. 2. Since there is no additional component needed in the circuit of the wireless transceiver chip 20 for the notch filter, the cost for producing the chip 20 or device having the chip 20 is reduced.

In one embodiment of the present invention, the wireless transceiver chip 20 further comprises an electrostatic discharge (ESD) protection circuit 283 connected to the filter capacitor 281 in parallel for ESD protection. When the phenomenon of electrostatic discharge occurs, the current passes through the discharge path 34 of the secondary conductor 225 and the ESD protection circuit 283 to the ground pad 203. Since the ESD protection circuit 283 is away from the transceiver pad 201 and the signal paths of signal transmitting and receiving, the performance of the chip 20 would not be degraded.

In one embodiment of the present invention the switch circuit 24 comprises a switch unit 241 connected between the first end 227 and the second end 229 of the secondary conductor 225. When receiving a signal, the transmitter circuit 22 is suspended and the switch unit 241 is configured to be open circuit, the signal is received by the antenna 205 to the receiver circuit 26 through the transceiver pad 201. When transmitting a signal, the receiver circuit 26 is suspended and the switch unit 241 is configured to be short circuit, the signal is amplified by the transmitter circuit 22, coupled form the primary conductor 223 to the secondary conductor 225, and transmitted by the antenna 205 through the transceiver pad 201.

In one embodiment of the present invention, the wireless transceiver chip 20 further comprises a resistor 285 connected to the filter capacitor 281 in parallel for providing a bias to the receiver circuit 26.

Figure 4:
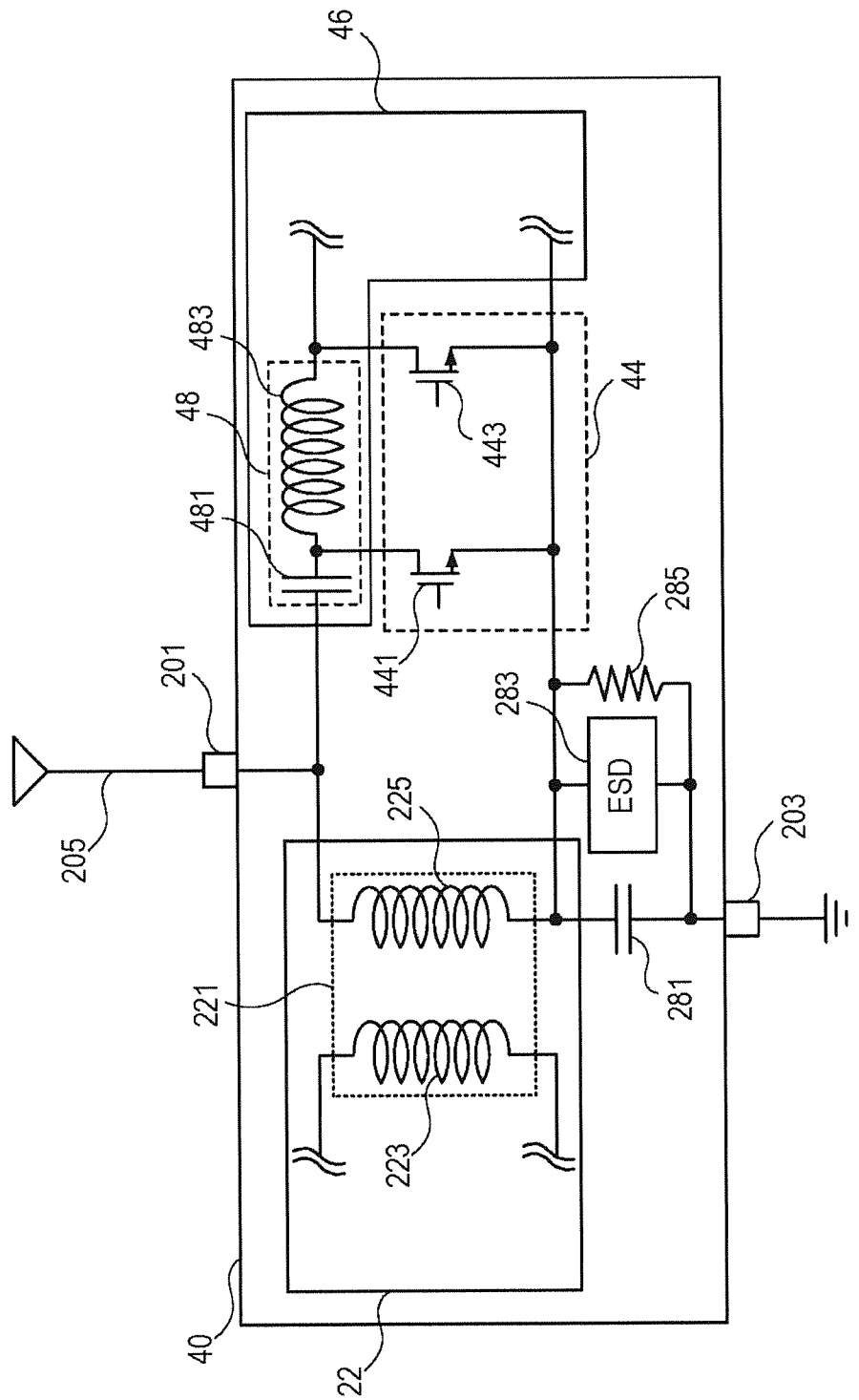
FIG. 4 is a schematic diagram showing the circuit of a wireless transceiver chip in accordance with another embodiment of the present invention.

Referring to FIG. 4, there is shown a schematic diagram of the circuit of a wireless transceiver chip in accordance with another embodiment of the present invention. The circuit of the wireless transceiver chip 40 of the present embodiment is substantially the same as the embodiment shown in FIG. 2. The receiver circuit 46 of the present embodiment further comprises a filter unit 48 connected to the transceiver pad 201 and the first end 227 of the secondary conductor 225 for filtering the frequency band of the signal. The filter unit 48 comprises a capacitor 481 and an inductor 483. The switch circuit 44 of the present embodiment comprises a first switch unit 441 and a second switch unit 443, wherein the first switch unit 441 and the second switch unit 443 connect the two ends of the inductor 483 with the second end 229 of the secondary conductor 225 respectively.

When receiving a signal, the transmitter circuit 22 is suspended and the first switch unit 441 and the second switch unit 443 of the switch circuit 44 are configured to be open circuit, the signal is received by the antenna 205 to the receiver circuit 46 through the transceiver pad 201. When transmitting a signal, the receiver circuit 26 is suspended and the first switch unit 441 and the second switch unit 443 of the switch circuit 44 are configured to be short circuit, the signal is amplified by the transmitter circuit 22, coupled form the primary conductor 223 to the secondary conductor 225, and transmitted by the antenna 205 through the transceiver pad 201.

Since the notch filter of the present invention is constructed by the secondary conductor 225 of the transformer 221 and the filter capacitor 281 to filter the image signal out and no additional inductor is needed, the cost for producing the chip and device with the chip is reduced. Furthermore, the ESD protection circuit 283 is connected to the filter capacitor 281 in parallel and away from the signal paths of transmitting and receiving, the performance of the wireless transceiver chip would not be degraded.

Although particular embodiments of the invention have been described in detail for purposes of illustration, various modifications and enhancements may be made without departing from the scope of the invention specified by the claims.

What is claimed is:

1. A circuit of a wireless transceiver chip comprising: a transceiver pad connected to an antenna;
   a ground pad connected to ground;
   a transmitter circuit for amplifying a transmitting signal, wherein the transmitter circuit has a transformer with a primary conductor and a secondary conductor, the secondary conductor has a first end and a second end, the first end is connected to the transceiver pad;
   a receiver circuit connected to the first end and the second end of the secondary conductor for receiving a receiving signal;
   a switch circuit connected between the receiver circuit and the secondary conductor; and
   a filter capacitor connected between the second end of the secondary conductor and the ground pad.

2. The circuit as claimed in claim 1, further comprising an electrostatic discharge protection circuit connected to the filter capacitor in parallel.

3. The circuit as claimed in claim 1, further comprising a resistor connected to the filter capacitor in parallel.

4. The circuit as claimed in claim 1, wherein the switch circuit comprises a first switch unit connected between the first end and the second end of the secondary conductor.

5. The circuit as claimed in claim 1, wherein the receiver circuit comprises a filter unit.

6. The circuit as claimed in claim 5, wherein the filter unit comprises a capacitor and an inductor connected in series.

7. The circuit as claimed in claim 6, wherein the switch circuit comprises a first switch unit and a second switch unit connected between the two ends of the inductor of the filter unit and the second end of the secondary conductor respectively.

* * * * *